(12) United States Patent
Toyoshima

(10) Patent No.: US 8,153,946 B2
(45) Date of Patent: Apr. 10, 2012

(54) SEMICONDUCTOR DEVICE

(75) Inventor: Yoshiaki Toyoshima, Kashiwa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 759 days.

(21) Appl. No.: 12/266,266

(22) Filed: Nov. 6, 2008

(65) Prior Publication Data
US 2009/0128224 A1 May 21, 2009

(30) Foreign Application Priority Data
Nov. 6, 2007 (JP) ................................. 2007-288963

(51) Int. Cl.
H01L 27/00 (2006.01)
(52) U.S. Cl. ...................... 250/208.1; 250/226; 348/308
(58) Field of Classification Search ............... 250/208.1; 348/308
See application file for complete search history.

(56) References Cited

U.S. PATENT DOCUMENTS

| | | | | |
|---|---|---|---|---|
| 5,698,844 A * | 12/1997 | Shinohara et al. | ........ | 250/214 R |
| 5,942,774 A * | 8/1999 | Isogai et al. | ................... | 257/292 |
| 6,184,055 B1 * | 2/2001 | Yang et al. | ........................ | 438/57 |
| 6,784,934 B1 | 8/2004 | Watanabe | | |
| 6,853,044 B1 * | 2/2005 | Chung et al. | ................... | 257/444 |
| 2001/0002844 A1 * | 6/2001 | Orava et al. | .................... | 348/218 |
| 2004/0233310 A1 * | 11/2004 | Egawa et al. | .................. | 348/301 |
| 2006/0232580 A1 | 10/2006 | Koyama | | |
| 2006/0243883 A1 * | 11/2006 | Yahazu et al. | .............. | 250/208.1 |
| 2008/0237447 A1 * | 10/2008 | Chan et al. | ................. | 250/208.1 |

FOREIGN PATENT DOCUMENTS

| | | |
|---|---|---|
| JP | 2000-175107 | 6/2000 |
| JP | 2000-244818 | 9/2000 |

* cited by examiner

Primary Examiner — Georgia Y Epps
Assistant Examiner — Kevin Wyatt
(74) Attorney, Agent, or Firm — Turocy & Watson, LLP

(57) ABSTRACT

A semiconductor device includes a light-receiving element which is connected to a negative power supply and generates conductive carriers by receiving light, an amplifier transistor which is a depletion transistor and amplifies an electrical signal obtained by the conductive carriers, and a transfer gate transistor which is a depletion transistor and is controlled by a negative potential applied to a gate to electrically connect or disconnect the light-receiving element and the amplifier transistor.

9 Claims, 5 Drawing Sheets

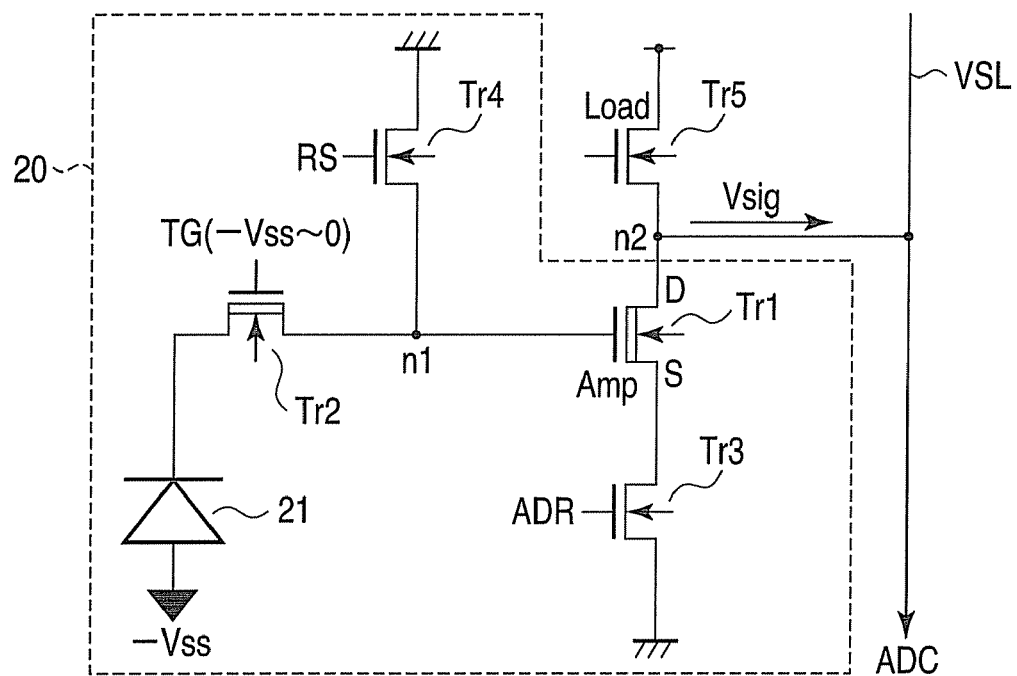
F I G. 2
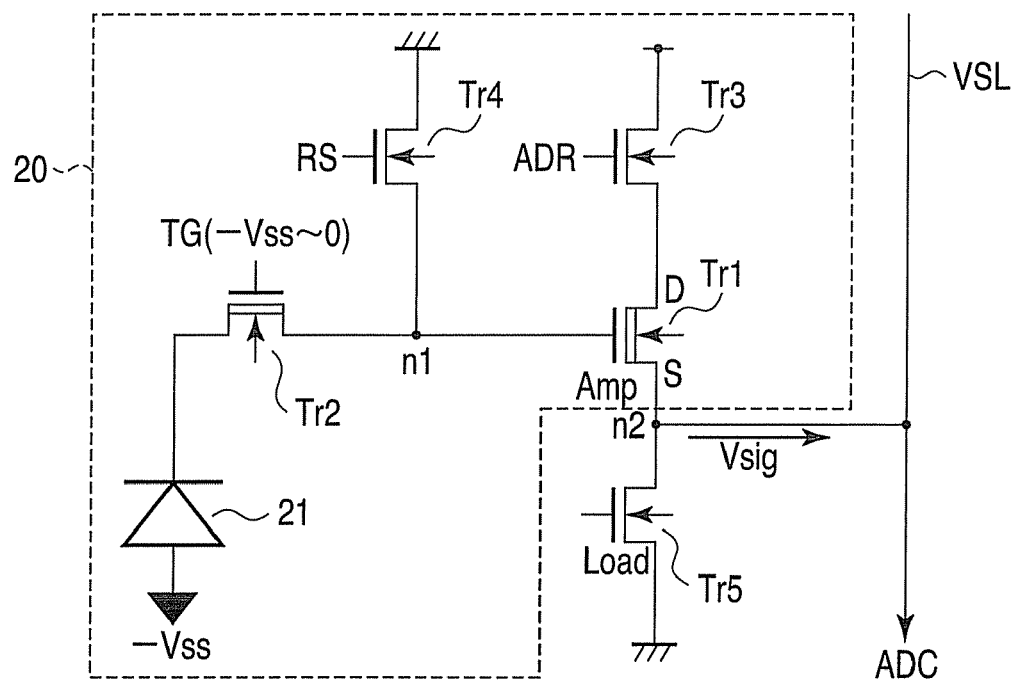
F I G. 3

SEMICONDUCTOR DEVICE

CROSS-REFERENCE TO RELATED APPLICATIONS

This application is based upon and claims the benefit of priority from prior Japanese Patent Application No. 2007-288963, filed Nov. 6, 2007, the entire contents of which are incorporated herein by reference.

BACKGROUND

CMOS image sensors as disclosed in, e.g., JP 2000-244818 and JP 2000-175107 are known as semiconductor devices. A pixel cell of these CMOS image sensors includes a light-receiving photo diode, and an amplification circuit that amplifies electric charge generated by the photo diode in accordance with the light amount, and transmits the amplified electric charge to an A/D converter.

A CMOS image sensor like this has the problem that when the pixel cells are downsized, noise generated from circuit elements deteriorates the quality of a sensed image. When the pixel cells are downsized, the photo diodes are also downsized. This decreases the light amount per unit time that can be received by the image sensor. On the other hand, a MOS transistor forming the pixel cell generates noise to some extent. As the pixel cells are downsized, however, the ratio of an optical signal to the noise of the MOS transistor, i.e., the S/N ratio significantly lowers. Noise that particularly exerts influence on the image quality of an image sensor is called 1/f noise because the frequency component is proportional to the reciprocal of the frequency. The origin of the 1/f noise is presumably charge and discharge that occur at a certain probability with respect to the interface state existing in the interface between a gate insulating film and semiconductor in a MOS transistor. To decrease this interface state density, the manufacturing steps of the MOS transistor are improved and controlled. However, it is difficult to make the interface state density lower than certain amount of density. Accordingly, the S/N ratio significantly decreases as the pixel cells are downsized as described above.

Since the origin of the 1/f noise is the interface state in the interface between the insulating film and semiconductor, the generation amount of the 1/f noise changes in accordance with the structure of the MOS transistor forming the pixel cell. The structures of MOS transistors are classified into an enhancement structure and depletion structure. In an enhancement transistor conventionally used in an image sensor, the probability of charge and discharge of the interface state increases, so the 1/f noise increases more easily than in a depletion transistor.

Furthermore, since the conventional pixel cell uses the enhancement MOS transistor, the operating point of an amplification circuit must be set at a high voltage. However, peripheral circuits such as an A/D converter operate at a lower voltage owing to LSI scaling down. Accordingly, the high-voltage operation of the amplification circuit hardly matches the low-voltage operation of the peripheral circuits in the scaled image sensors.

BRIEF SUMMARY OF THE INVENTION

A semiconductor device according to an aspect of the present invention comprising a light-receiving element which is connected to a negative power supply and generates conductive carriers by receiving light; an amplifier transistor which is a depletion transistor and amplifies an electrical signal obtained by the conductive carriers; and a transfer gate transistor which is a depletion transistor and is controlled by a negative potential applied to a gate to electrically connect or disconnect the light-receiving element and the amplifier transistor.

BRIEF DESCRIPTION OF THE SEVERAL VIEWS OF THE DRAWING

FIG. 2 is an equivalent circuit diagram showing circuit configuration example 1 of a pixel cell shown in FIG. 1;

FIG. 3 is an equivalent circuit diagram showing circuit configuration example 2 of the pixel cell shown in FIG. 1;

DETAILED DESCRIPTION OF THE INVENTION

Figure 1:
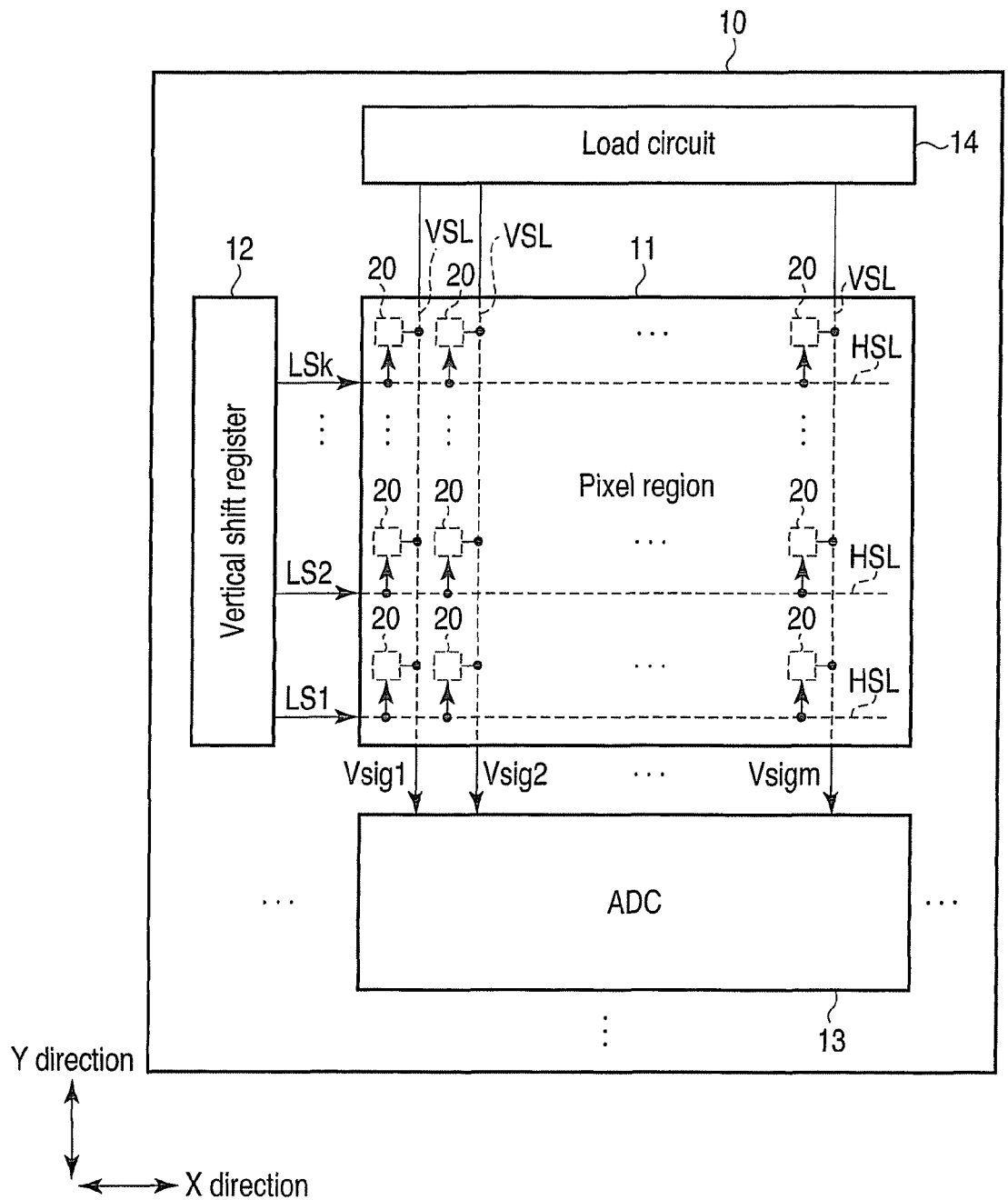
FIG. 1 is an exemplary view of a semiconductor device according to an embodiment.

An embodiment of the present invention will be explained below with reference to the accompanying drawing. In the following explanation, the same reference numerals denote the same parts throughout the drawing.

[1] Arrangement of Semiconductor Device

FIG. 1 is an exemplary view of a semiconductor device according to an embodiment of the present invention. An outline of the arrangement of the semiconductor device will be explained below.

As shown in FIG. 1, a chip 10 of the semiconductor device has a pixel region 11, vertical shift register 12, A/D converter (ADC) 13, and load circuit 14. This semiconductor device functions as, e.g., a CMOS image sensor.

A plurality of pixel cells 20 are arranged in the form of an array in the pixel region 11. The pixel cell 20 includes a photo diode for storing incident light by photoelectrically converting it, and functions as an image sensing unit. In the pixel region 11, a plurality of horizontal signal lines HSL run in the X direction (row direction), and a plurality of vertical signal lines VSL run in the Y direction (column direction). A plurality of pixel cells 20 arranged in the X direction are connected to a common horizontal signal line HSL. A plurality of pixel cells 20 arranged in the Y direction are connected to a common vertical signal line VSL.

The vertical shift register 12 is placed in the periphery of the pixel region 11, and connected to one end portion of each horizontal signal line HSL. The vertical shift register 12 functions as a selector for selecting a pixel cell 20 for each horizontal signal line HSL.

The A/D converter 13 is placed in the periphery of the pixel region 11, and connected to one end portion of each vertical signal line VSL. The A/D converter 13 has a function of converting an analog signal Vsigm (m=1, 2, 3, . . . ) into a digital signal.

The load circuit 14 is placed in the periphery of the pixel region 11, and connected to the other end portion of each vertical signal line VSL. The load circuit 14 includes a load transistor Tr5 (to be described later). The load transistor Tr5 is connected to each vertical signal line VSL, and shared by a plurality of pixel cells 20 connected to the same vertical signal line VSL.

In the semiconductor device as described above, a pixel cell 20 is selected by a signal LSk (k=1, 2, 3, . . . ) output from the vertical shift register 12. An analog signal Vsig corresponding to the amount of incident light is output from the pixel cell 20, and input to the A/D converter 13 via the vertical signal line VSL. The A/D converter 13 converts the analog signal Vsig into a digital signal.

[2] Pixel Cell

[2-1] Example 1

FIG. 2 shows an equivalent circuit of circuit configuration example 1 of the pixel cell shown in FIG. 1. One pixel cell 20 in the pixel region 11 shown in FIG. 1 will be explained below as an example.

As shown in FIG. 2, the pixel cell 20 includes a photo diode 21, amplifier transistor Tr1, transfer gate transistor Tr2, address transistor Tr3, and reset transistor Tr4.

The photo diode 21 is a light-receiving element for generating conductive carriers corresponding to the received light amount. The anode of the photo diode 21 is connected to a negative power supply to which a negative power supply voltage −Vss is applied. The photo diode 21 is, e.g., a p-n junction diode. Electric charge corresponding to the amount of light received by this p-n junction is stored in the photo diode 21 and a potential well formed by the source diffusion layer of the transfer gate transistor Tr2.

The amplifier transistor Tr1 amplifies an electrical signal obtained by conductive carriers from a node n1, and outputs the signal Vsig. The gate of the amplifier transistor Tr1 is connected to the node n1. The current path of the amplifier transistor Tr1 has one end (a source) connected to one end of the current path of the address transistor Tr3, and the other end (a drain) connected to a node n2. The node n2 is connected to the vertical signal line VSL.

The transfer gate transistor Tr2 electrically connects or disconnects the photo diode 21 and amplifier transistor Tr1, thereby achieving a switching function. Thus, the transfer gate transistor Tr2 controls the storage of conductive carriers in the photo diode 21. The gate of the transfer gate transistor Tr2 is connected to a transfer signal line TG. The current path of the transfer gate transistor Tr2 has one end (a source) connected to the cathode of the photo diode 21, and the other end (a drain) connected to the node n1. The transfer signal line TG is connected to the negative power supply. The gate potential of the transfer gate transistor Tr2 is controlled between −Vss and 0V.

The gate of the address transistor Tr3 is connected to an address signal line ADR. The current path of the address transistor Tr3 has one end connected to one end (the source) of the current path of the amplifier transistor Tr1, and the other end connected to a ground terminal.

The reset transistor Tr4 resets the gate potential of the amplifier transistor Tr1. The gate of the reset transistor Tr4 is connected to a reset signal line RS. The current path of the reset transistor Tr4 has one end connected to a ground terminal, and the other end connected to the node n1.

The gate of the load transistor Tr5 is connected to a positive power supply. The current path of the load transistor Tr5 has one end connected to the node n2, and the other end connected to a power supply terminal.

In this embodiment, depletion MOSFETs are used as the amplifier transistor Tr1 and transfer gate transistor Tr2. A threshold voltage Vth of this depletion transistor ranges from the negative power supply voltage −Vss to 0V. On the other hand, enhancement MOSFETs having a positive threshold voltage Vth are used as the address transistor Tr3, reset transistor Tr4, and load transistor Tr5.

Referring to FIG. 2, the transfer signal line TG, address signal line ADR, and reset signal line RS run in the same direction perpendicular to the vertical signal line VSL. That is, the horizontal signal lines HSL shown in FIG. 1 include the transfer signal line TG, address signal line ADR, and reset signal line RS.

[2-2] Example 2

FIG. 3 shows an equivalent circuit of circuit configuration example 2 of the pixel cell shown in FIG. 1. One pixel cell 20 in the pixel region 11 shown in FIG. 1 will be explained below as an example. An explanation of the same features as those of example 1 will not be repeated in example 2.

As shown in FIG. 3, the pixel cell 20 of example 2 differs from that of example 1 in that the address transistor Tr3 and load transistor Tr5 connected to the two ends of the current path of the amplifier transistor Tr1 are switched.

More specifically, the current path of the amplifier transistor Tr1 has one end (a source) connected to one end of the current path of the load transistor Tr5 via the node n2, and the other end (a drain) connected to one end of the current path of the address transistor Tr3.

In example 2 as described above, the amplifier transistor Tr1 and load transistor Tr5 form a source-follower circuit. The source-follower circuit herein mentioned is one configuration of an amplifier, and is a circuit that connects a load resistor to the source of the amplifier transistor Tr1 and outputs a voltage generated across the two terminals of the load resistor to the next stage.

In examples 1 and 2 described above, at least two transistors, i.e., the amplifier transistors Tr1 and transfer gate transistor Tr2 to which the photoelectrically converted electric charge is directly applied are depletion transistors in order to reduce noise. Note that at least one of the address transistor Tr3, reset transistor Tr4, and load transistor Tr5 may also be a depletion transistor.

[3] Enhancement Transistor & Depletion Transistor

[3-1] Structures

Figure 4:
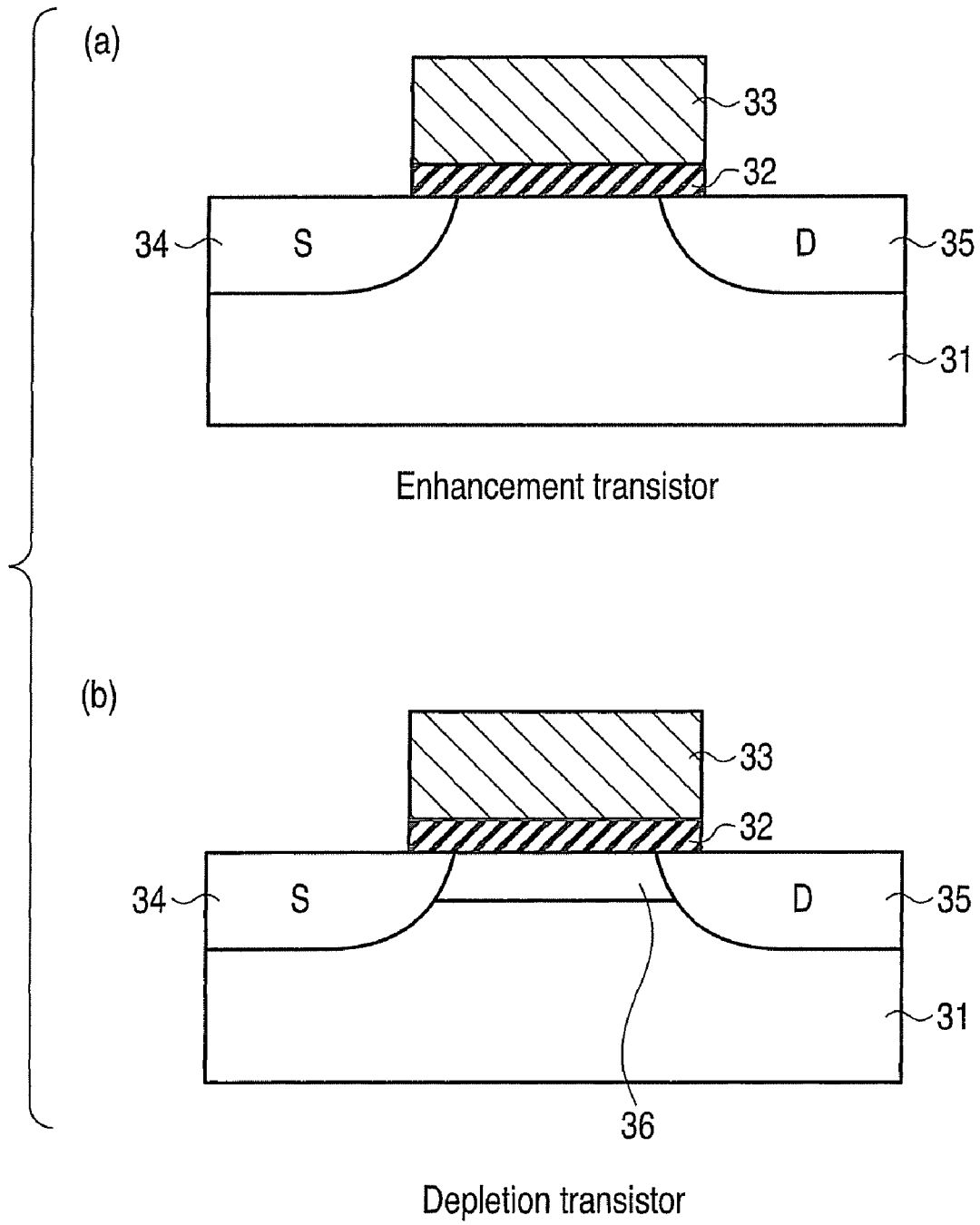
FIG. 4 is a schematic sectional view of an enhancement MOS transistor and depletion MOS transistor according to the embodiment.

FIGS. 4(a) and 4(b) are schematic sectional views of an enhancement MOS transistor and depletion MOS transistor according to the embodiment of the present invention.

In the enhancement MOS transistor as shown in FIG. 4(a), a gate electrode 33 is formed on a gate insulating film 32 on a semiconductor substrate 31. A source diffusion layer 34 and drain diffusion layer 35 are formed in the semiconductor substrate 31 on the two sides of the gate electrode 33. The semiconductor substrate 31 has a conductivity type different from that of the source diffusion layer 34 and drain diffusion layer 35.

As shown in FIG. 4(b), the depletion MOS transistor differs from the enhancement MOS transistor in that a buried channel 36 is formed between the source diffusion layer 34 and drain diffusion layer 35 below the gate electrode 33. The buried channel 36 has the same conductivity type as that of the source diffusion layer 34 and drain diffusion layer 35.

[3-2] Electrical Characteristics

Figure 5:
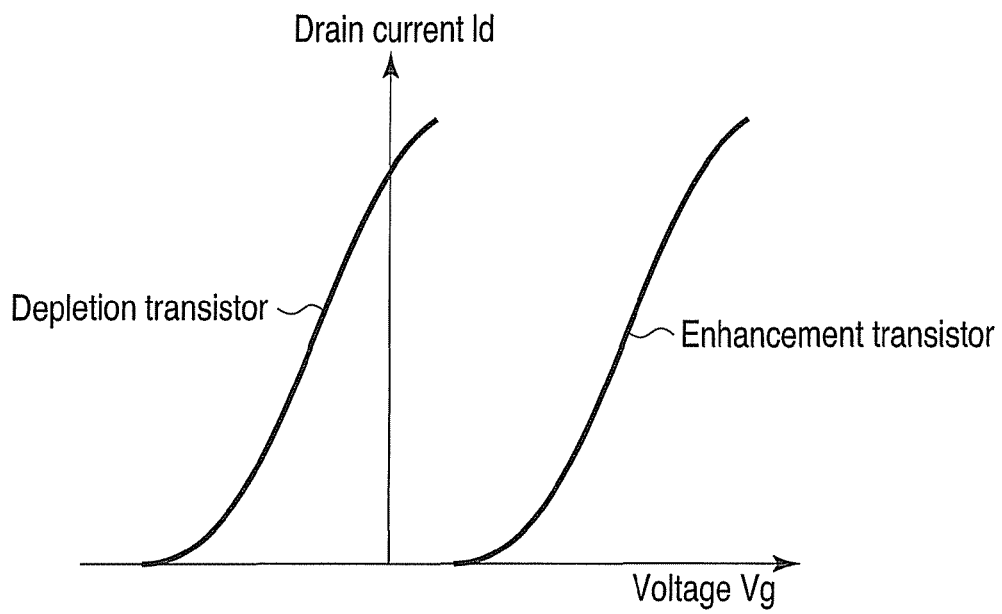
FIG. 5 is a graph showing the gate voltage Vg vs. drain electrode Id characteristics of the enhancement transistor and depletion transistor according to the embodiment.

FIG. 5 shows the gate voltage Vg vs. drain current Id characteristics of the enhancement transistor and depletion transistor according to the embodiment of the present invention. The basic electrical characteristics of the two transistors have the following difference.

As shown in FIG. 5, the Id-Vg characteristic curve of the enhancement transistor exists in the positive voltage region. Accordingly, the enhancement transistor is turned on when a positive voltage Vg is applied, and hence has a positive threshold voltage Vth.

On the other hand, the Id-Vg characteristic curve of the depletion transistor is shifted to the negative voltage region compared to that of the enhancement transistor. In the depletion transistor, therefore, the source-to-drain path is electrically turned on even when, e.g., Vg=0 because the buried channel 36 exists. That is, the depletion transistor has a negative threshold voltage Vth. Note that it is possible to deplete the buried channel 36 and turn off the transistor by applying a negative voltage Vg.

[3-3] 1/f Noise Characteristics

Figure 6:
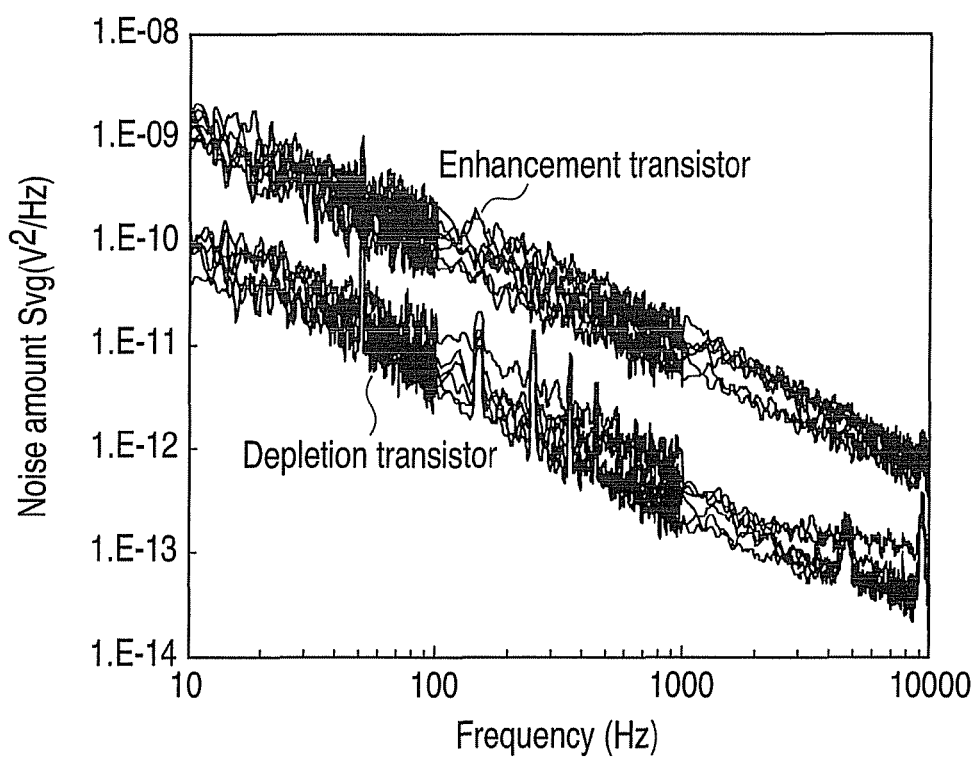
FIG. 6 is a graph comparing the 1/f noise characteristics of the enhancement transistor and depletion transistor according to the embodiment.

FIG. 6 is a graph comparing the 1/f noise characteristics of the enhancement transistor and depletion transistor according to the embodiment of the present invention. Note that the enhancement transistor and depletion transistor shown in FIG. 6 were formed under the same conditions.

As shown in FIG. 6, the noise amount of the depletion transistor is about an order of magnitude smaller than that of the enhancement transistor over the broad frequency region for the following reason.

The enhancement transistor is turned on because the channel of an inversion layer is formed near the gate insulating film. However, since the inversion layer is very thin, carriers collectively run near the interface of the insulating film. This increases the probability of charge and discharge of the interface state, and often increases the 1/f noise.

By contrast, in the depletion transistor, carriers in the ON state run as they widely distribute in the direction of depth of the buried channel. In the depletion transistor, therefore, the probability of charge and discharge of the interface state decreases, so the 1/f noise is produced much more hardly than in the enhancement transistor.

[4] Read Operation

An optical charge read operation of the CMOS image sensor of this embodiment will be explained below with reference to FIG. 3.

First, the potential of the detection node n1 is −Vss, and the transfer gate transistor Tr2 is OFF. When the reset transistor Tr4 is turned on in this state, the potential of the detection node n1 is precharged to 0V. That is, since the detection node n1 is also the gate electrode of the amplifier transistor Tr1, the gate potential of the amplifier transistor Tr1 is reset to 0V.

Then, the gate of the amplifier transistor Tr1 is set to float by turning off the reset transistor Tr4.

When the transfer gate transistor Tr2 is turned on after that, the potential of the detection node n1 changes in accordance with the charge amount stored in the photo diode 21. More specifically, excited carriers stored in the photo diode 21 change the potential of the detection node n1 in the negative direction. When the address transistor Tr3 is turned on in this state, the source-follower circuit formed by the amplifier transistor Tr1 and load transistor Tr5 is activated. Consequently, the amplifier transistor Tr1 amplifies the potential of the detection node n1, thereby obtaining the amplified signal Vsig. The amplified signal Vsig is read out from the node n2 to the A/D converter (ADC).

Figure 7:
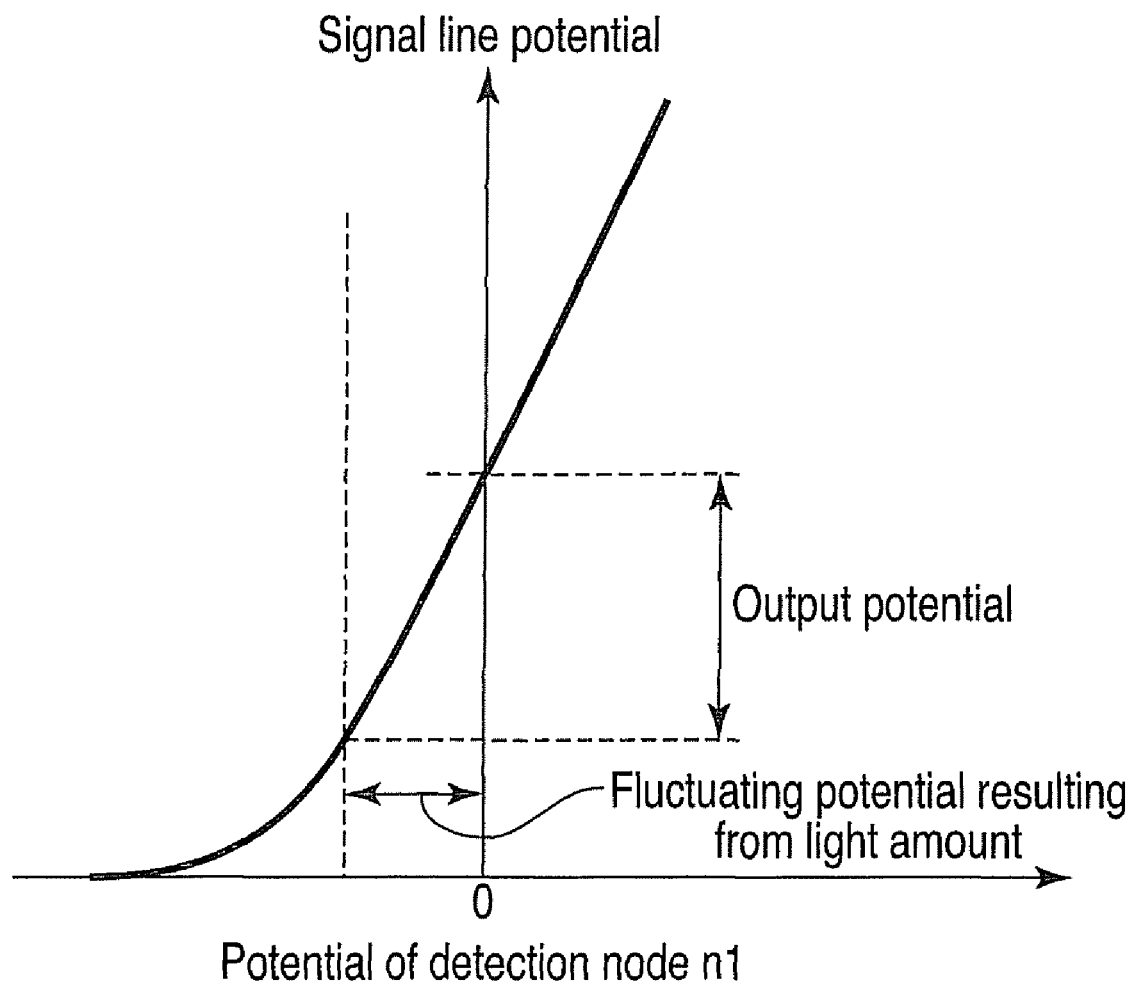
FIG. 7 is a graph showing the relationship between the amplification of a signal and the potential corresponding to a light amount transmitted to a detection node shown in FIGS. 2 and 3.

The relationship between the signal Vsig and the potential corresponding to the light amount transmitted to the detection node n1 will be explained below with reference to FIG. 7.

The fluctuating potential resulting from the light amount transmitted to the detection node n1 is amplified as the output potential of the signal line VSL by the amplifier transistor Tr1. The output potential of the signal line VSL desirably maintains linearity as much as possible. As is apparent from FIG. 7, the depletion amplifier transistor Tr1 as in this embodiment maintains linearity from the negative potential region to the positive potential region. In the optical charge read of this embodiment, therefore, the potential of the detection node n1 is set negative as described previously. This is so because even when a negative-potential operating point is thus selected, the depletion transistor well maintains the linearity of the output potential.

[5] Effects

In the semiconductor device for a CMOS image sensor according to this embodiment, the amplifier transistor Tr1 and transfer gate transistor Tr2 are depletion transistors. Consequently, carriers in the ON state can be widely dispersed in the direction of depth of the channel when compared to the case where enhancement transistors are used as the amplifier transistor Tr1 and transfer gate transistor Tr2. This makes it possible to decrease the probability of charge and discharge of the interface state. Accordingly, it is possible to largely reduce the influence of the 1/f noise that causes an unexpected point display defect, and improve the image quality of the CMOS image sensor.

Also, the amplifier transistor Tr1 and transfer gate transistor Tr2 as depletion transistors are shifted to negative-power driving while the photo diode 21 is connected to the negative power supply and a dynamic range equivalent to that of an enhancement type amplifier transistor and enhancement type transfer gate transistor is maintained. Accordingly, the operating point of the amplification circuit can be set at a low voltage near, e.g., the ground potential. Even when peripheral circuits such as the A/D converter 13 are operating at a low voltage owing to micropatterning or the like, therefore, it is possible to readily match the signal levels of the peripheral circuits and amplification circuit. Consequently, the overall sensor array and LSI chip can be micropatterned and operated at a low voltage. Furthermore, it is possible to suppress the increase in drain current caused by the rise of the operating point on the Id-Vg characteristic curve, and reduce the power consumption.

In addition, as described previously, it is possible to largely increase the signal/noise ratio of a semiconductor photosensor, and implement a fine sensor element. This makes it possible to implement an array type photosensor having a large number of pixels.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a light-receiving element which is connected to a negative power supply and generates conductive carriers by receiving light;
an amplifier transistor which is a depletion transistor and amplifies an electrical signal obtained by the conductive carriers;
a transfer gate transistor which is a depletion transistor and is controlled by a negative potential applied to a gate to electrically connect or disconnect the light-receiving element and the amplifier transistor;
an address transistor having a current path having one end connected to a source of the amplifier transistor and the other end connected to a ground terminal;
a reset transistor which has a current path having one end connected to a ground terminal and the other end connected to a gate of the amplifier transistor, and controls a gate potential of the amplifier transistor; and
a load transistor having a current path having one end connected to a drain of the amplifier transistor and the other end connected to a power supply terminal,
wherein at least one of the address transistor and the load transistor is a depletion transistor.

2. The device according to claim 1, further comprising:
a plurality of pixel cells each including the light-receiving element, the amplifier transistor, the transfer gate transistor, the address transistor, and the reset transistor, and arranged in the form of an array;
a plurality of first signal lines to each of which a plurality of pixel cells arranged in a row direction are connected together, and each of which is connected to a gate of the transfer gate transistor, a gate of the address transistor, and a gate of the reset transistor; and
a second signal line to which a plurality of pixel cells arranged in a column direction are connected together.

3. The device according to claim 2, further comprising an A/D converter connected to an end portion of the second signal line.

4. The device according to claim 2, wherein the drain of the amplifier transistor is connected to the second signal line.

5. A semiconductor device comprising:
a light-receiving element which is connected to a negative power supply and generates conductive carriers by receiving light;
an amplifier transistor which is a depletion transistor and amplifies an electrical signal obtained by the conductive carriers;
a transfer gate transistor which is a depletion transistor and is controlled by a negative potential applied to a gate to electrically connect or disconnect the light-receiving element and the amplifier transistor;
an address transistor having a current path having one end connected to a drain of the amplifier transistor and the other end connected to a power supply terminal;
a reset transistor which has a current path having one end connected to a ground terminal and the other end connected to a gate of the amplifier transistor, and controls a gate potential of the amplifier transistor; and
a load transistor having a current path having one end connected to a source of the amplifier transistor and the other end connected to a ground terminal,
wherein at least one of the address transistor and the load transistor is a depletion transistor.

6. The device according to claim 5, further comprising:
a plurality of pixel cells each including the light-receiving element, the amplifier transistor, the transfer gate transistor, the address transistor, and the reset transistor, and arranged in the form of an array;
a plurality of first signal lines to each of which a plurality of pixel cells arranged in a row direction are connected together, and each of which is connected to a gate of the transfer gate transistor, a gate of the address transistor, and a gate of the reset transistor; and
a second signal line to which a plurality of pixel cells arranged in a column direction are connected together.

7. The device according to claim 6, further comprising an A/D converter connected to an end portion of the second signal line.

8. The device according to claim 6, wherein the source of the amplifier transistor is connected to the second signal line.

9. The device according to claim 5, wherein the amplifier transistor and the load transistor form a source-follower circuit.

* * * * *